United States Patent
Hood, III et al.

(10) Patent No.: US 7,440,293 B2
(45) Date of Patent: Oct. 21, 2008

(54) METHOD AND APPARATUS FOR MOUNTING A CARD IN AN INFORMATION HANDLING SYSTEM

(75) Inventors: Charles D. Hood, III, Cedar Park, TX (US); Ajay Kwatra, Austin, TX (US); John Revell, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 546 days.

(21) Appl. No.: 10/997,495

(22) Filed: Nov. 24, 2004

(65) Prior Publication Data

US 2006/0109636 A1 May 25, 2006

(51) Int. Cl.
*H05K 7/02* (2006.01)
*H05K 7/04* (2006.01)
(52) U.S. Cl. .................................. 361/810; 361/807
(58) Field of Classification Search ............. 361/788, 361/810, 807, 792, 786, 684
See application file for complete search history.

(56) References Cited

U.S. PATENT DOCUMENTS

| | | | |
|---|---|---|---|
| 5,440,755 A * | 8/1995 | Harwer et al. | 710/315 |
| 5,903,439 A * | 5/1999 | Tamarkin | 361/742 |
| 6,261,104 B1 | 7/2001 | Leman | |
| 6,273,730 B1 * | 8/2001 | Chang | 439/61 |
| 6,533,587 B1 | 3/2003 | Potter et al. | |
| 6,731,515 B2 * | 5/2004 | Rhoads | 361/796 |
| 6,749,439 B1 | 6/2004 | Potter et al. | |

\* cited by examiner

*Primary Examiner*—Hung S Bui
(74) *Attorney, Agent, or Firm*—Haynes and Boone, LLP

(57) ABSTRACT

An apparatus for mounting a card in an information handling system provides a first riser card including a plurality of first connections. A second riser card is coupled to the first riser card by a plurality of connectors, the second riser card including a plurality of second connections. A first card slot extends from the first riser card and is electrically coupled to the plurality of first connections, and a second card slot extends from the first riser card and is electrically coupled to the plurality of second connections. The apparatus may be coupled to an information handling system in a chassis to provide for the mounting of cards in the chassis.

25 Claims, 6 Drawing Sheets

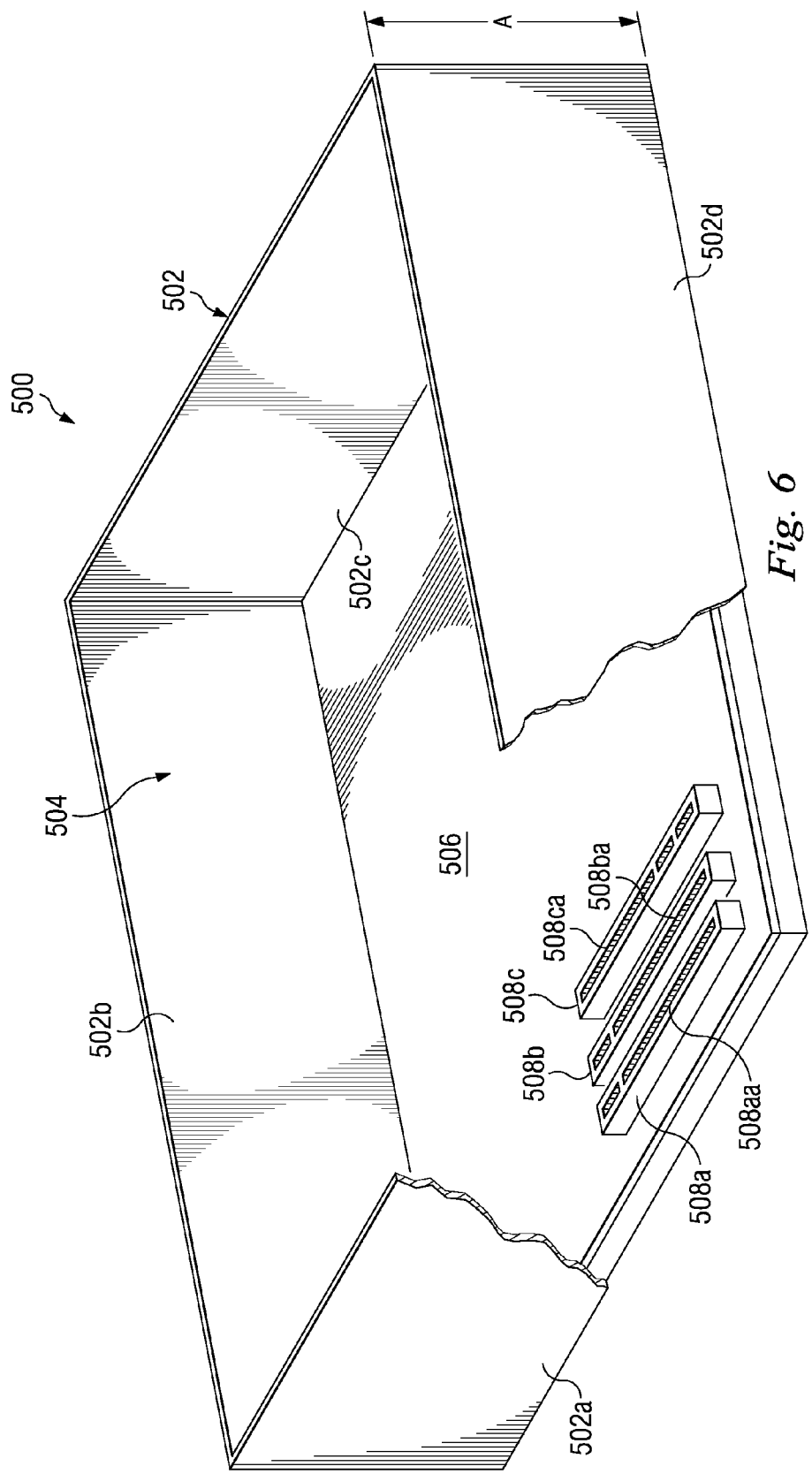

METHOD AND APPARATUS FOR MOUNTING A CARD IN AN INFORMATION HANDLING SYSTEM

BACKGROUND

The present disclosure relates generally to information handling systems, and more particularly to mounting a card in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A trend in the manufacture of information handling systems is smaller chassis sizes which result in the information handling system taking up less space. Smaller form factor systems such as, for example, the Balanced Technology Extended (BTX) form factor systems designed by Intel, have substantially lower heights than standard systems.

As the size of the system is reduced, the components used in the system require modification. For example, the BTX system provides a number of expansion card slots, which include Peripheral Component Interconnect (PCI) and Peripheral Component Interconnect Express (PCIE) slots, for mounting expansion cards in the system. The height of the BTX systems require reduced height expansion cards, as full height expansion cards require more vertical space than the system chassis will allow.

However, customers desire an option that allows full height PCI cards and/or PCI and PCIE graphics cards to be used in the smaller form factor systems. Present solutions to this problem significantly increase the price of the information handling system.

Accordingly, it would be desirable to provide for mounting a card in an information handling system absent the disadvantages found in the prior methods discussed above.

SUMMARY

According to one embodiment, an apparatus for mounting a card in an information handling system provides a first riser card including a plurality of first connections. A second riser card is coupled to the first riser card by a plurality of connectors, the second riser card including a plurality of second connections. A first card slot extends from the first riser card and is electrically coupled to the plurality of first connections, and a second card slot extends from the first riser card and is electrically coupled to the plurality of second connections.

A principal advantage of this embodiment is that it allows full height expansion cards to be used in the reduced form factor information handling systems at a relatively low cost.

BRIEF DESCRIPTION OF THE DRAWINGS

FIG. 6 is a perspective view illustrating an embodiment of a chassis used with the apparatus of FIGS. 5*a* and 5*b*.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
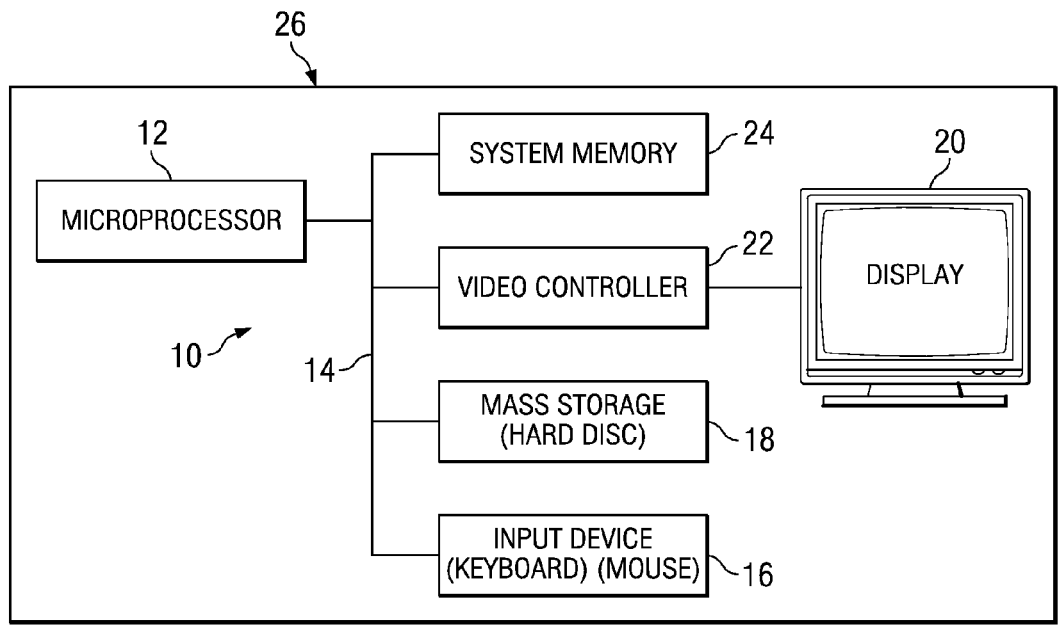
FIG. 1 is a schematic view illustrating an embodiment of an information handling system.

In one embodiment, information handling system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. A chassis 26 may be provided in order to house some or all of the components of the information handling system 10. It should be understood that other busses and intermediate circuits can be deployed between the components described above and microprocessor 12 to facilitate interconnection between the components and the microprocessor.

Figure 2:
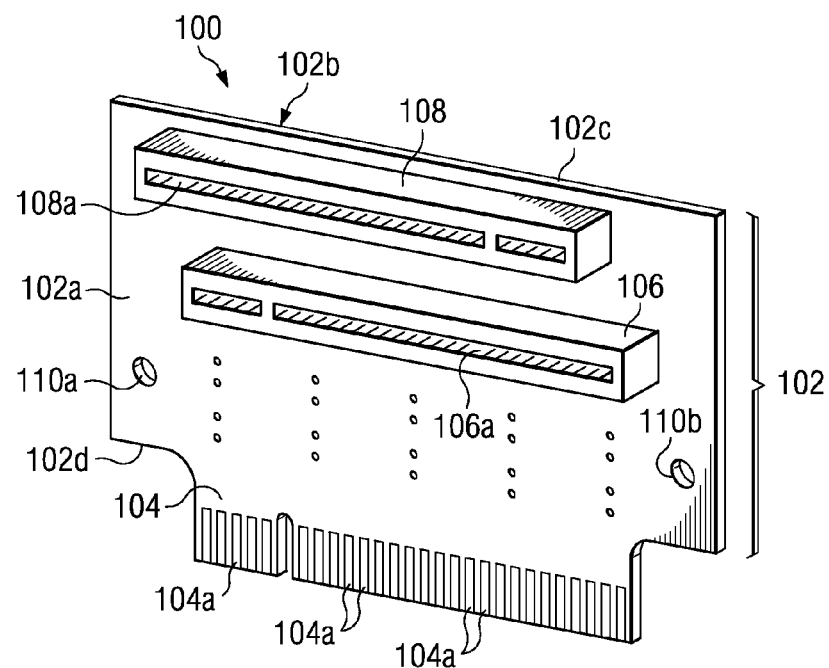
FIG. 2 is a perspective view illustrating an embodiment of a first riser card used with an apparatus for mounting a card in an information handling system.

Referring now to FIG. 2, a first riser card 100 includes a substantially rectangular base 102 having a front surface 102a, a back surface 102b opposite the front surface 102a, a top 102c, and a bottom 102d opposite the top 102c. A first connection member 104 extends from the bottom 102d of the base 102 and includes a plurality of first connections 104a. In an embodiment, the first connection member 104 with the first connections 104a is operable to matingly engage a PCIE slot. The first connection member 104 with the first connections 104a is operable to matingly engage a PCI slot. An elongated first card coupling member 106 extends from the front surface 102a of base 102 and includes a first card slot 106a positioned along its length. In an embodiment, the first card slot 106a is electrically coupled to the first connections 104a. The first card slot 106a is a PCIE card slot. In an embodiment, first card slot 106a is a PCI card slot. An elongated second card coupling member 108 is positioned between the first card coupling member 106 and the top 102c of base 102, extends from the front surface 102a of base 102, and includes a second card slot 108a positioned along its length. In an embodiment, second card slot 108a is a PCIE card slot. In an embodiment, second card slot 108a is a PCI card slot. A plurality of mounting apertures 110a and 110b are defined by the base 102, extend from the front surface 102a to the back surface 102b, and are positioned between the first coupling member 106 and the bottom 102d of body 102 and in a spaced apart relationship on opposite sides of the body 102.

Figure 3:
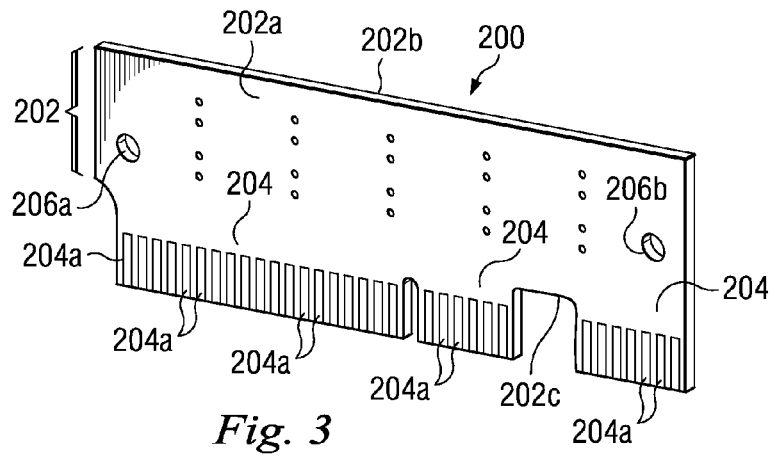
FIG. 3 is a perspective view illustrating an embodiment of a second riser card used with the first riser card of FIG. 2.

Referring now to FIG. 3, a second riser card 200 includes a substantially rectangular body 202 including a front surface 202a, a top 202b and a bottom 202c opposite the top 202b. A second connection member 204 extends from the bottom 202c of the base 202 and includes a plurality of second connections 204a. In an embodiment, the second connection member 204 with the second connections 204a is operable to matingly engage a PCIE slot. In an embodiment, the second connection member 204 with the second connections 204a is operable to matingly engage a PCI slot. A plurality of mounting apertures 206a and 206b are defined by the base 202, extend from the front surface 202a to the back surface 202b, and are positioned in a spaced apart relationship on opposite sides of the body 202.

Figure 4:
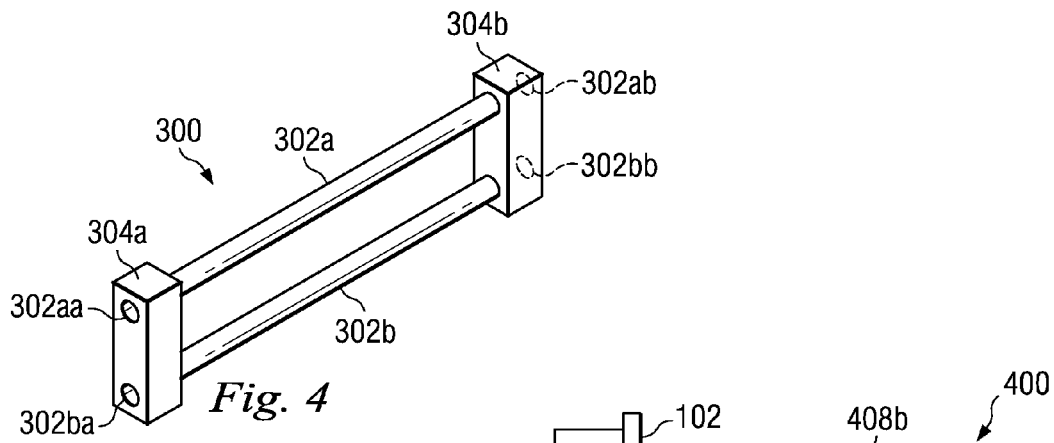
FIG. 4 is a perspective view illustrating an embodiment of connector used with the first riser card of FIG. 2 and the second riser card of FIG. 3.

Referring now to FIG. 4, a connector 300 includes a pair of connector members 302a and 302b held substantially parallel to each other by a pair of supports 304a and 304b. Connector member 302a includes an end 302aa and an end 302ab opposite the end 302aa, and connector member 302b includes end 302ba and end 302bb opposite the end 302ba. Connector member 302a is operable to provide an electrical coupling between ends 302aa and 302ab, and connector member 302b is operable to provide an electric coupling between ends 302ba and 302bb. In an embodiment, the connector members 302a and 302b are rigid members. In an embodiment, the connector members 302a and 302b are bridge connectors.

Figure 5B:
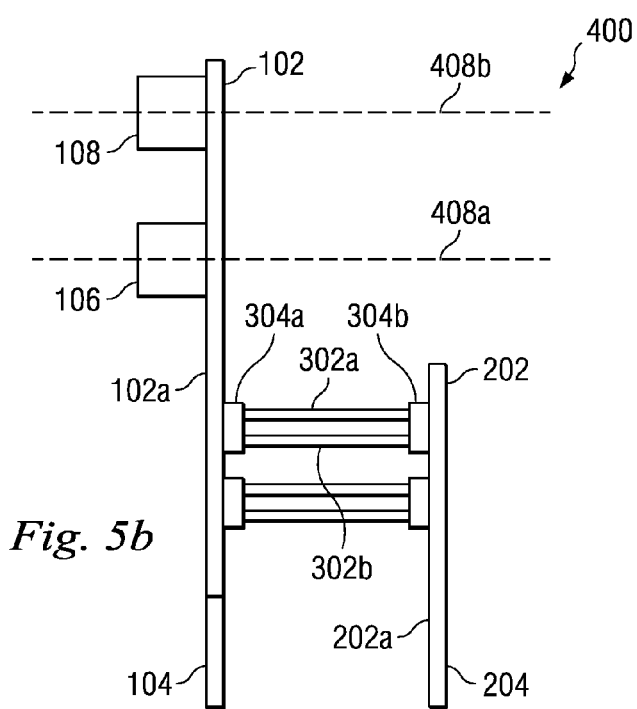
FIG. 5*b* is a side view illustrating an embodiment of an apparatus for mounting a card in an information handling system with the first riser card of FIG. 2, the second riser card of FIG. 3, and a plurality of the connectors of FIG. 4.
Figure 5A:
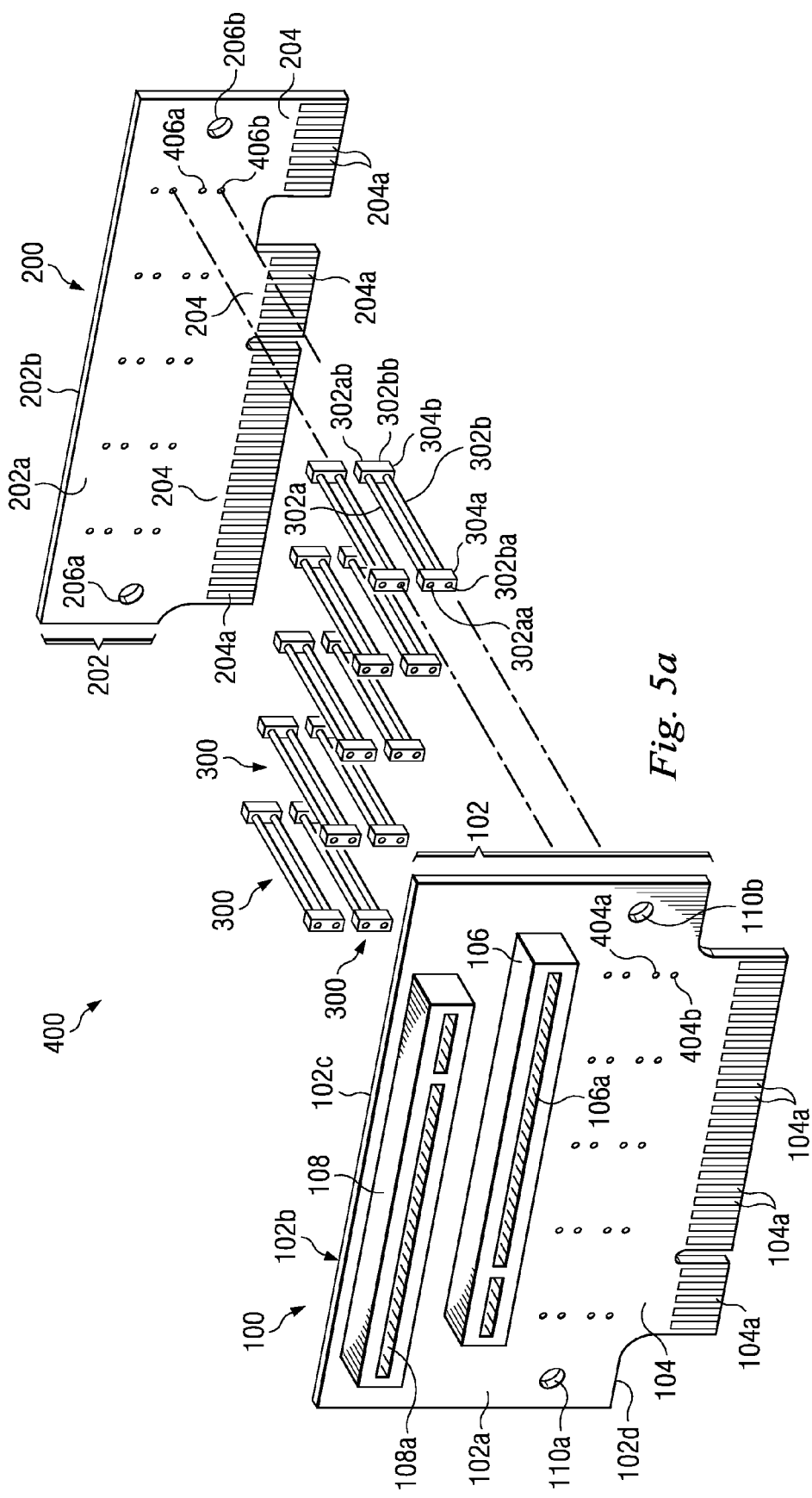
FIG. 5*a* is a perspective view illustrating an embodiment of the assembly of an apparatus for mounting a card in an information handling system with the first riser card of FIG. 2, the second riser card of FIG. 3, and a plurality of the connectors of FIG. 4.
Figure 7:
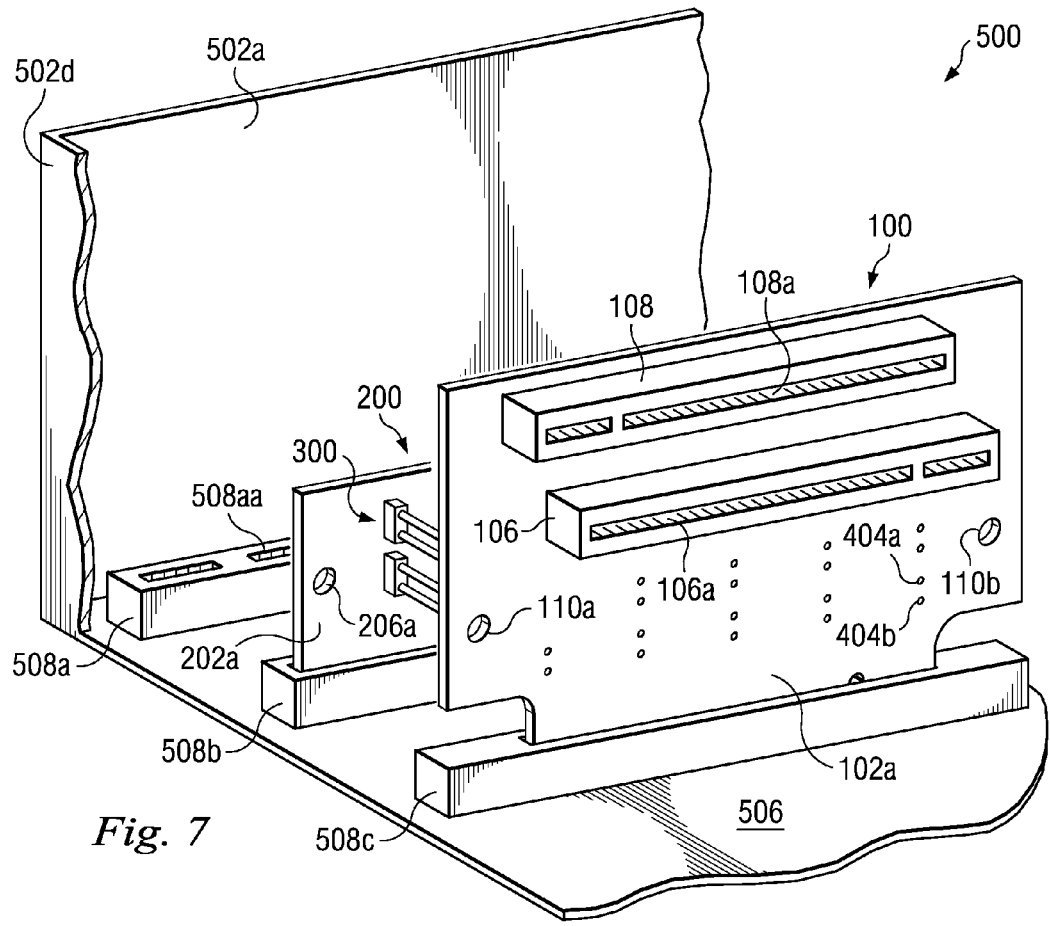
FIG. 7 is a perspective view illustrating an embodiment of the assembly of the apparatus of FIGS. 5*a* and 5*b* and the chassis of FIG. 6.

Referring now to FIGS. 5a and 5b, in assembly operation, an apparatus 400 for mounting a card in an information handling system is assembled by positioning first riser card 100 and second riser card 200 such that front surface 102a of first riser card 100 is substantially parallel to front surface 202a of second riser card 200. A plurality of connectors 300 are then positioned between, and coupled to, the first riser card 100 and the second riser card 200. A connector 300 may be coupled to the first riser card 100 and second riser card 200 by coupling ends 302aa and 302ab of connector member 302a to section 404a on first riser card 100 and section 406a on second riser card 200, respectively, and coupling ends 302ba and 302bb of connector member 302b to section 404b on first riser card 100 and section 406b on second riser card 200, respectively. Sections 406a and 406b on second riser card 200 provide an electrical coupling between second connections 204a and connector 300, and sections 404a and 404b on first riser card 100 provide an electrical coupling between connector 300 and second card slot 108a, which results in an electrical coupling between second connections 204a and second card slot 108a. Each of the plurality of connectors 300 may be coupled to the first riser card 100 and the second riser card 200 in the manner described above to different sections of the first riser card 100 and the second riser card 200. In an embodiment, the plurality of connectors 300 provide a rigid member which holds the first riser card 100 and the second riser card 200 substantially parallel to each other. The first card slot 106 includes an axis 408a and the second card slot 108 includes an axis 408b, and with the connectors coupling the first riser card 100 to the second riser card 200, the axis 408a and the axis 408b are substantially perpendicular to the front surface 102a of first riser card 100 and the front surface 202a of second riser card 200. The first riser card 100 and second riser card 200 may be mechanically coupled together and spaced apart by a structural member such as, for example, a chassis member, coupled to the first riser card 100 at mounting apertures 110a and 110b and to the second riser card at mounting apertures 206a and 206b.

Referring now to FIG. 6, an alternative embodiment of an apparatus 500 for mounting a card in an information handling system is substantially identical in design and operation to the apparatus 400 described above with reference to FIGS. 2, 3, 4, 5a and 5b, with the addition of a chassis 502. Chassis 502 includes a plurality of sides 502a, 502b, 502c and 502d, each having a height A and together defining a space 504 between them. A board 506 is positioned in the space 504 and includes a plurality of riser coupling members 508a, 508b, and 508c. Each riser coupling member 508a, 508b, and 508c includes a respective riser slot 508aa, 508ba, and 508ca positioned along its length. Riser slots 508aa, 508ba, and 508ca are coupled to an information handling system such as, for example, the information handling system 10 illustrated in FIG. 1. In various embodiments, riser slot 508aa may be a PCIE card slot or a PCI card slot. Riser slot 508ba maybe a PCIE card slot or a PCI card slot. Riser slot 508ca may be a PCIE card slot or a PCI card slot. Riser slots 508aa and 508ba may be PCI slots, and riser slot 508ca may be a PCIE slot.

Referring now to FIGS. 2, 3, 5a, 6, and 7, in operation, first connection member 104 on first riser card 100 is matingly engaged with first riser slot 508ca on riser coupling member 508c, electrically coupling first connections 104a to first riser slot 508ca. With first connections 104a electrically coupled to first riser slot 508ca, first riser slot 508ca is electrically coupled to first card slot 106a due to the electrical coupling between first connections 104a and first card slot 106a. While engaging first connection member 104 with first riser slot 508ca, second connection member 204 on second riser card 200 is matingly engaged with second riser slot 508ba on riser coupling member 508b, electrically coupling second connections 204a to second riser slot 508ba. With second connections 204a electrically coupled to second riser slot 508ba, second riser slot 508ba is electrically coupled to second card slot 108a due to the electrical coupling between second connections 204a and second card slot 108a through connectors 300. In an embodiment, first riser card 100 may be matingly engaged to riser coupling member 508b with second riser card 200 matingly engaged to riser coupling member 508a. In an embodiment, the apparatus 500 may include a third riser card, which is substantially similar to first riser card 100 and second riser card 200, electrically coupled to a third card slot on first riser card 100 and which is matingly engaged to riser coupling member 508a.

Figure 8:
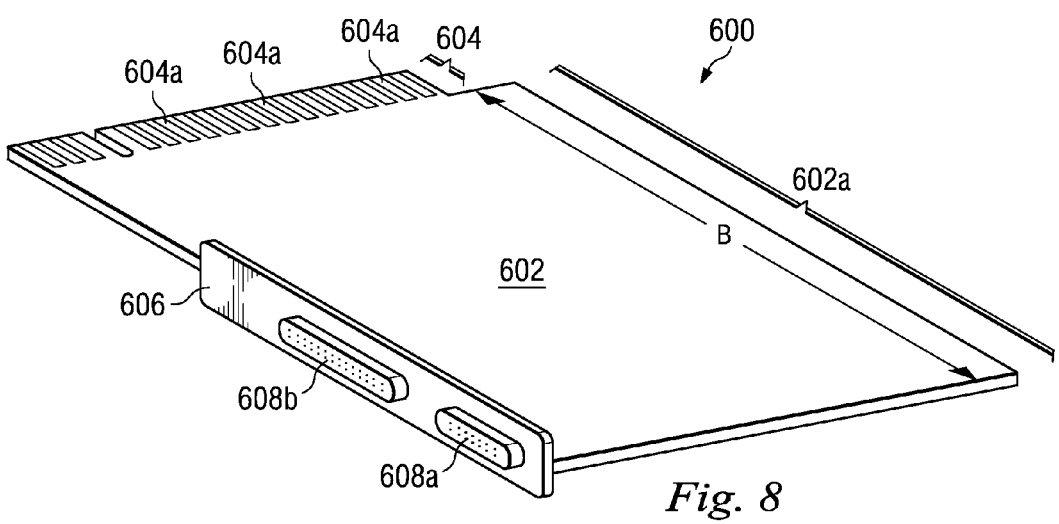
FIG. 8 is a perspective view illustrating an embodiment of a card used with the chassis and apparatus of FIG. 7.
Figure 9:
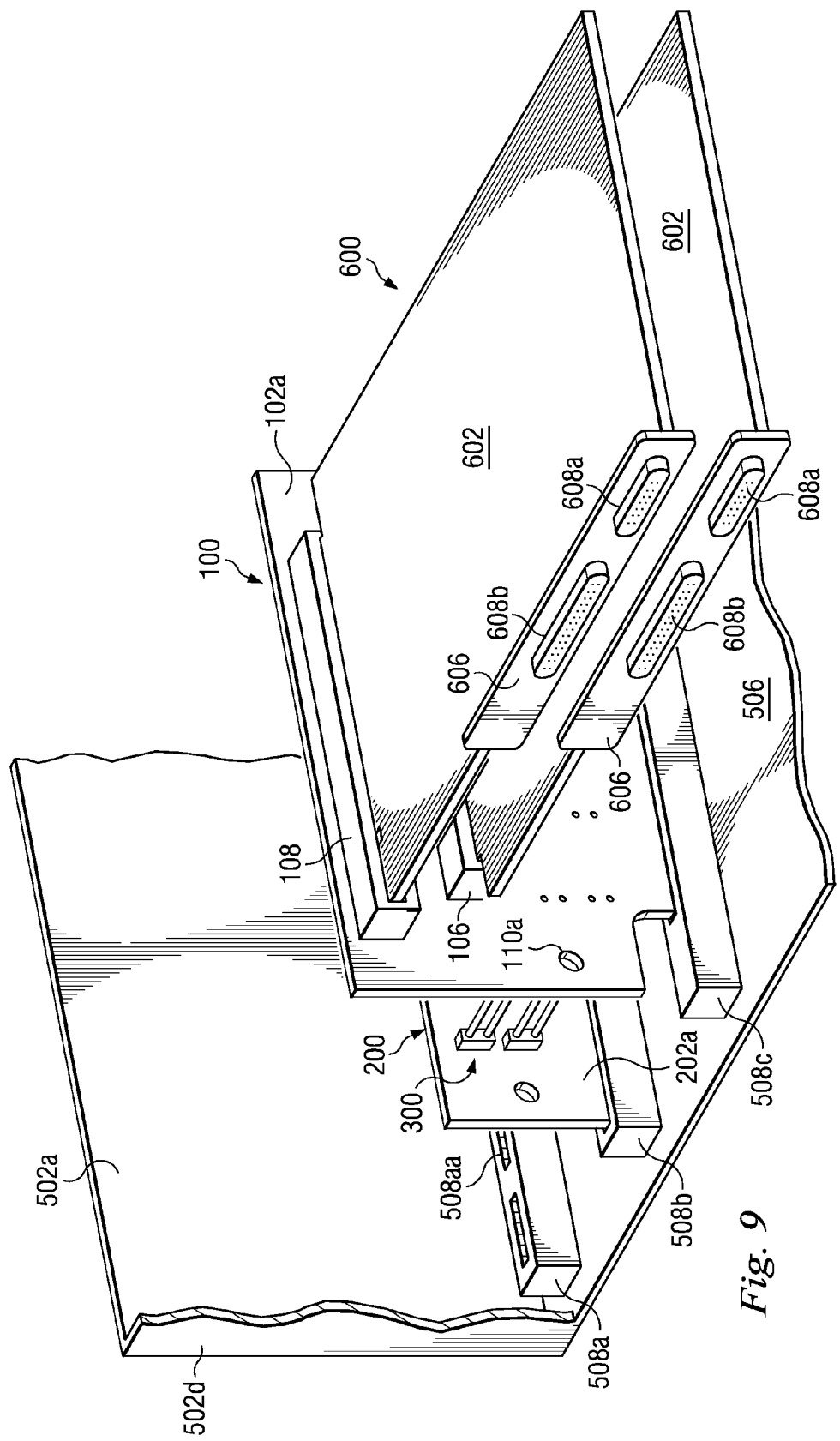
FIG. 9 is a perspective view illustrating an embodiment of the assembly of the card of FIG. 8 with the apparatus and chassis of FIG. 7.

Referring now to FIG. 8, an alternative embodiment of an apparatus 600 for mounting a card in an information handling system is substantially identical in structure and operation to the apparatus 400 and apparatus 500 described above with reference to FIGS. 1, 2, 3, 4, 5a, 5b, 6, and 7, with the addition of a card 602. Card 602 includes an elongated base 602a having a height B. In an embodiment, height B of card 602 is greater than the height A of sides 502a, 502b, 502c, and 502d on chassis 502, illustrated in FIG. 6. A card connection member 604 extends from an edge of the card 602 and includes a plurality of card connections 604a along its length. A connector plate 606 is positioned along an edge of the card 602 and includes a plurality of connectors 608a and 608b, which are electrically coupled to the card connections 604a, extending from its surface. In an embodiment, card 602 may be a PCIE card. In an embodiment, card 602 may be a PCI card.

Referring now to FIGS. 2, 3, 5a, 6, 7, 8 and 9, in operation, card connection member 604 on card 602 is matingly engaged with first card slot 106a on card coupling member 106, electrically coupling card connections 604a to first card slot 106a. With card connections 604a electrically coupled to first card slot 106a, first riser slot 508ca is electrically coupled to connectors 608a and 608b due to the electrical coupling between first connections 104a, first card slot 106a, card connections 604a, and connectors 608a and 608b. In an embodiment, a card 602 may be matingly engaged with second card slot 108a on card coupling member 108 in the same manner as described above with respect to first card slot 106a, providing an electrical coupling between the second riser slot 508ba and connectors 608a and 608b due to the electrical coupling between second connections 104a, second card slot 108a, card connections 604a, and connectors 608a and 608b.

It is understood that variations may be made in the foregoing without departing from the scope of the disclosed embodiments. Furthermore, elements and teachings of the various illustrative embodiments may be combined in whole or in part some or all of the illustrative embodiments.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for mounting a card in an information handling system comprising:
   a first riser card including a plurality of first connections;
   a second riser card including a plurality of second connections, the second riser card coupled to the first riser card by a plurality of connectors, each of the plurality of connectors including a rigid member that provides an electrical coupling between the first riser card and the second riser card, wherein the plurality of connectors are coupled to the first riser card and the second riser card in a spaced apart orientation;
   a first card slot extending from the first riser card and electrically coupled to the plurality of first connections; and
   a second card slot extending from the first riser card and electrically coupled by the plurality of connectors to the plurality of second connections.

2. The apparatus of claim 1 wherein the first card slot is a PCI card slot and the plurality of first connections are operable to matingly engage a PCI slot.

3. The apparatus of claim 1 wherein the first card slot is a PCIE card slot and the plurality of first connections are operable to matingly engage a PCIE slot.

4. The apparatus of claim 1 wherein the second card slot is a PCI card slot and the plurality of second connections are operable to matingly engage a PCI slot.

5. The apparatus of claim 1 wherein the second card slot is a PCIE card slot and the plurality of second connections are operable to matingly engage a PCIE slot.

6. The apparatus of claim 1 wherein the rigid members maintain a spacing between the first riser card and the second riser card.

7. The apparatus of claim 1 wherein the first card slot and the second card slot are positioned substantially perpendicular to the plurality of first connections and the plurality of second connections.

8. An information handling system comprising:
   a chassis;
   a first riser slot coupled to the chassis;
   a second riser slot coupled to the chassis
   a first riser card including a plurality of first connections matingly engaging the first riser slot;
   a second riser card including a plurality of second connections matingly engaging the second riser slot, the second riser card coupled to the first riser card by a plurality of spaced apart, rigid pins that provide an electrical coupling between the first riser card and the second riser card;
   a first card slot extending from the first riser card and electrically coupled to the plurality of first connections; and
   a second card slot extending from the first riser card and electrically coupled by the plurality of spaced apart, rigid pins to the plurality of second connections.

9. The system of claim 8 wherein the first riser slot is a PCI slot and the first card slot is a PCI card slot.

10. The system of claim 8 wherein the first riser slot is a PCIE slot and the first card slot is a PCIE card slot.

11. The system of claim 8 wherein the second riser slot is a PCI slot and the second card slot is a PCI card slot.

12. The system of claim 8 wherein the second riser slot is a PCIE slot and the second card slot is a PCIE card slot.

13. The system of claim 8 wherein the plurality of spaced apart, rigid pins maintain a spacing between the first riser card and the second riser card.

14. The system of claim 8 further comprising:
a card matingly engaging the first card slot.

15. The system of claim 14 wherein the card is a PCI card.

16. The system of claim 14 wherein the card is a PCIE card.

17. The system of claim 8 further comprising:
a card matingly engaging the second card slot.

18. The system of claim 17 wherein the card is a PCI card.

19. The system of claim 17 wherein the card is a PCIE card.

20. The system of claim 8 wherein the first card slot and the second card slot are positioned substantially perpendicular to the first riser slot and the second riser slot.

21. An apparatus for mounting a card in an information handling system comprising:
a first riser card including a plurality of first connections operable to matingly engage a PCIE slot;
a second riser card coupled to the first riser card by a plurality of connectors, the second riser card including a plurality of second connections operable to engage a PCI slot;
a PCIE card slot extending from the first riser card, the PCIE card slot electrically coupled to the plurality of first connections;
a PCI card slot extending from the first riser card, the PCI card slot electrically coupled by the plurality of connectors to the plurality of second connections; and
wherein the plurality of connectors each include a rigid member, and the plurality of rigid members provide an electrical coupling and maintain a spacing between the first riser card and the second riser card.

22. An apparatus for mounting a card in an information handling system comprising:
a first riser card including a plurality of first connections operable to matingly engage a PCI slot;
a second riser card including a plurality of second connections operable to engage a PCI slot, the second riser card coupled to the first riser card by a plurality of connectors, each of the plurality of connectors including a rigid member that provides an electrical coupling between the first riser card and the second riser card, wherein the plurality of connectors are coupled to the first riser card and the second riser card in a spaced apart orientation;
a first PCI card slot extending from the first riser card, the first PCI card slot electrically coupled to the plurality of the first connections; and
a second PCI card slot extending from the first riser card, the second PCI card slot electrically coupled by the plurality of connectors to the plurality of second connections.

23. The apparatus of claim 22 wherein the plurality of rigid members maintain a spacing between the first riser card and the second riser card.

24. A method for mounting a card in an information handling system comprising:
providing an information handling system including a chassis and a first riser slot and a second riser slot mounted in the chassis;
providing a card mounting apparatus comprising:
a first riser card, the first riser card including a plurality of first connections, a first card slot electrically coupled to the plurality of first connections, and a second card slot; and
a second riser card rigidly coupled to the first riser card by a plurality of spaced apart, rigid members that provide an electrical coupling between the first riser card and the second riser card, the second riser card including a plurality of second connections that are electrically coupled by the plurality of spaced apart, rigid members to the second card slot;
matingly engaging the plurality of the first connections to the first riser slot;
matingly engaging the plurality of second connections to the second riser slot; and
coupling a card to the first card slot and/or the second card slot.

25. The method of claim 24 wherein the plurality of spaced apart, rigid members maintain a spacing between the first riser card and the second riser card.

* * * * *

UNITED STATES PATENT AND TRADEMARK OFFICE
CERTIFICATE OF CORRECTION

| | | |
|---|---|---|
| PATENT NO. | : 7,440,293 B2 | Page 1 of 1 |
| APPLICATION NO. | : 10/997495 | |
| DATED | : October 21, 2008 | |
| INVENTOR(S) | : Charles D. Hood, III et al. | |

It is certified that error appears in the above-identified patent and that said Letters Patent is hereby corrected as shown below:

Claim 24, Column 8, Line 30; after the word of delete "the".

Signed and Sealed this

Twenty-first Day of April, 2009

JOHN DOLL
*Acting Director of the United States Patent and Trademark Office*